US009187820B2

(12) United States Patent
Kawaguchi et al.

(10) Patent No.: US 9,187,820 B2
(45) Date of Patent: Nov. 17, 2015

(54) RADIO WAVE TRANSMITTING DECORATIVE MEMBER

(75) Inventors: Toshiyuki Kawaguchi, Tokyo (JP); Kazutoki Tahara, Saitama (JP); Tsutomu Saga, Saitama (JP)

(73) Assignee: SHIN-ETSU POLYMER CO., LTD. (JP)

(*) Notice: Subject to any disclaimer, the term of this patent is extended or adjusted under 35 U.S.C. 154(b) by 679 days.

(21) Appl. No.: 12/678,375

(22) PCT Filed: Sep. 18, 2008

(86) PCT No.: PCT/JP2008/066833
§ 371 (c)(1), (2), (4) Date: Mar. 16, 2010

(87) PCT Pub. No.: WO2009/038116
PCT Pub. Date: Mar. 26, 2009

(65) Prior Publication Data
US 2010/0207842 A1     Aug. 19, 2010

(30) Foreign Application Priority Data

Sep. 18, 2007 (JP) .............................. P2007-241416
Sep. 18, 2007 (JP) .............................. P2007-241417
Jul. 29, 2008 (JP) .............................. P2008-194739
Jul. 29, 2008 (JP) .............................. P2008-194740

(51) Int. Cl.
*H01Q 1/00* (2006.01)
*C23C 14/20* (2006.01)
*B32B 15/08* (2006.01)

(52) U.S. Cl.
CPC .................................. *C23C 14/205* (2013.01)

(58) Field of Classification Search
CPC ........ H01Q 1/00; C23C 14/205; C23C 14/14; C23C 14/20; B32B 15/08

USPC .......... 343/711, 713, 872, 873, 907; 428/432, 428/411.1, 412, 446, 457
See application file for complete search history.

(56) References Cited

U.S. PATENT DOCUMENTS 3,208,070 A * 9/1965 Boicey .......................... 343/712
5,693,404 A * 12/1997 Shiraishi et al. .............. 428/156
(Continued)

FOREIGN PATENT DOCUMENTS

CN       1652398 A       8/2005
JP       6-322520        11/1994
(Continued)

OTHER PUBLICATIONS

Office Action dated Mar. 6, 2012 issued in corresponding Japanese Patent Application No. 2008-194739 with English translation (6 pages).
(Continued)

*Primary Examiner* — Michael C Wimer
(74) *Attorney, Agent, or Firm* — Ostroenk Faber LLP

(57) ABSTRACT

There is provided a radio wave transmitting decorative member which has radio wave transmitting properties as well as mirror-surface like metallic luster, the radio wave transmitting decorative member which hardly loses its metallic luster and which can be produced at a low cost. More specifically, disclosed is a radio wave transmitting decorative member including a substrate, and a light reflecting layer provided on top of the substrate and formed of an alloy composed of either silicon or germanium and a metal, wherein the light reflecting layer is preferably a deposition film formed by a physical vapor deposition of an alloy composed of either silicon or germanium and a metal.

6 Claims, 10 Drawing Sheets

(56) References Cited

U.S. PATENT DOCUMENTS

| | | | |
|---|---|---|---|
| 6,328,358 B1 * | 12/2001 | Berweiler | 293/115 |
| 6,706,407 B2 * | 3/2004 | Sugiyama et al. | 428/432 |
| 7,333,401 B2 * | 2/2008 | Kawakami | 368/232 |
| 7,619,575 B2 * | 11/2009 | Kamiya et al. | 343/713 |
| 2005/0031897 A1 * | 2/2005 | Kamiya et al. | 428/689 |

FOREIGN PATENT DOCUMENTS

| | | |
|---|---|---|
| JP | 9-97011 | 4/1997 |
| JP | 2002-65873 | 3/2002 |
| JP | 2002-173340 | 6/2002 |
| JP | 2002-339084 | 11/2002 |
| JP | 3414717 | 4/2003 |
| JP | 2003-344622 | 12/2003 |
| JP | 2005-055329 | 3/2005 |
| JP | 2005-234188 | 9/2005 |
| JP | 2005-249773 | 9/2005 |
| JP | 2006-276008 | 10/2006 |
| JP | 2006-282886 | 10/2006 |
| JP | 2007-64696 | 3/2007 |
| JP | 2007-093241 | 4/2007 |
| JP | 2008-207337 | 9/2008 |

OTHER PUBLICATIONS

Office Action dated Mar. 6, 2012 issued in corresponding Japanese Patent Application No. 2008-194740 with English translation (6 pages).

Office Action dated Mar. 29, 2011 issued in corresponding Japanese Patent Application No. 2008-194739 with English translation (6 pages).

Office Action dated Mar. 29, 2011 issued in corresponding Japanese Patent Application No. 2008-194740 with English translation (7 pages).

International Search Report and Written Opinion mailed Oct. 28, 2008 in corresponding PCT International Application No. PCT/JP2008/066833.

Office Action dated Jul. 16, 2012 issued in corresponding Chinese Patent Application No. 200880107358.7 with English translation (23 pages).

* cited by examiner

10nm

14

50nm

10nm

50nm

14

RADIO WAVE TRANSMITTING DECORATIVE MEMBER

CROSS-REFERENCE TO RELATED APPLICATIONS

The present application is a 35 U.S.C. §§371 national phase conversion of PCT/JP2008/066833, filed Sep. 18, 2008, which claims priority of Japanese Patent Application No. 2007-241416, filed Sep. 18, 2007, Japanese Patent Application No. 2007-241417, filed Sep. 18, 2007, Japanese Patent Application No. 2008-194739, filed Jul. 29, 2008, and Japanese Patent Application No. 2008-194740, filed Jul. 29, 2008, the contents of which are incorporated herein by reference. The PCT International Application was published in the Japanese language.

TECHNICAL FIELD

The present invention relates to a radio wave transmitting decorative member having metallic luster.

BACKGROUND OF THE ART

From the viewpoint of design properties, metallic decorative members, in particular, decorative members having mirror-surface like metallic luster have been widely used in the casing or button of a mobile phone; the casing of a watch; and the front grille, bumper or the like of a vehicle.

As such decorative members, a decorative member that transmits radio waves (microwaves or the like) without adversely affecting the radio waves has been required for the following reasons.

(i) An antenna for transmitting and receiving radio waves is disposed inside the casing of a mobile phone.

(ii) An antenna for receiving radio waves is disposed inside the casing of a radio controlled clock that is provided with a function to receive the standard wave and to automatically correct errors.

(iii) In a vehicle equipped with a radar device that detects the presence of obstacles or measures the distance between vehicles, an antenna in the radar device is disposed in the vicinity of a front grille or a bumper.

(iv) The frequency of radio waves used in the communication devices or the like has been shifting to a high frequency range of about 100 GHz, at which radio waves are readily affected by the decorative members, and thus these devices are prone to functional disorders.

The following materials have been proposed as the decorative members that allow the passing through of radio waves and are provided with metallic luster.

(1) A shaped product having a deposited film of indium, an indium alloy, tin, or a tin alloy, on a substrate (refer to Patent Document 1).

(2) A transfer material having a deposited film of an indium/indium oxide complex on a base material (refer to Patent Document 2).

(3) A decorative product having a coating film, in which fine pieces of luminescent materials are dispersed, on a base material (refer to Patent Document 3).

(4) A decorative product having a reflective film (metal) which is provided with an opening on a base material (refer to Patent Document 4).

With respect to the metal deposited film of indium, tin, lead, zinc, bismuth, antimony, or the like, it has been known that because the metal is present as a minute independent island, radio waves can pass through the gaps between the islands where no metal is present. For this reason, the decorative members described above in (1) and (2) have radio wave transmitting properties as well as metallic luster.

However, with respect to the decorative members of (1) and (2), if the thickness of the metal deposited film is increased in order to attain a satisfactory level of metallic luster, the islands become partially connected with each other and form a network that serves as a good conductor, and thus the reflection or absorption of radio waves occurs depending on the frequency thereof.

In addition, tin is prone to oxidation, chlorination, or the like, as a result of which the metallic luster thereof is lost over time. On the other hand, indium is highly expensive.

Because the above decorative member of (3) is a product in which luminescent materials are dispersed in a coating film, it is not provided with mirror-surface like metallic luster.

On the other hand, with respect to the above decorative member of (4), only radio waves having a specific frequency that conforms to the size of the opening of the light reflecting layer can pass therethrough.

[Patent Document 1] Japanese Laid-Open Patent Application No. 2005-249773

[Patent Document 2] Japanese Patent No. 3414717

[Patent Document 3] Japanese Laid-Open Patent Application No. 2006-282886

[Patent Document 4] Japanese Laid-Open Patent Application No. 2006-276008

DISCLOSURE OF THE INVENTION

Problems to be Solved by the Invention

The present invention provides a radio wave transmitting decorative member having radio wave transmitting properties as well as mirror-surface like metallic luster, the radio wave transmitting decorative member which hardly loses its metallic luster and which can be produced at a low cost.

Means for Solving the Problems

A radio wave transmitting decorative member of the present invention is characterized by having a substrate, and a light reflecting layer provided on top of the substrate and formed of an alloy composed of either silicon or germanium and a metal.

The above light reflecting layer is preferably a deposition film formed by a physical vapor deposition of an alloy composed of either silicon or germanium and a metal.

In the above light reflecting layer, it is preferable that no gaps be present where the aforementioned alloy is absent.

The aforementioned metal is preferably a metal exhibiting a reflectance of 50% or higher.

The ratio of the aforementioned metal within the aforementioned alloy (which is 100% in terms of volume) is preferably within a range from 0.1 to 60 volume %.

The aforementioned substrate is preferably a shaped article formed of an organic polymer.

The thickness of the light reflecting layer is preferably within a range from 10 to 500 nm.

The radio wave transmitting decorative member of the present invention may include a mask layer provided between the aforementioned substrate and the aforementioned light reflecting layer and containing a white pigment.

The radio wave transmitting decorative member of the present invention may also include an adhesion promoting layer provided between the aforementioned substrate and the aforementioned light reflecting layer.

Alternatively, a radio wave transmitting decorative member of the present invention is characterized by having a substrate, and a light reflecting layer provided on top of the substrate and formed of a semiconductor material.

The above light reflecting layer is preferably a deposition film formed by a physical vapor deposition of a semiconductor material.

In the above light reflecting layer, it is preferable that no gaps be present where the aforementioned semiconductor material is absent.

The aforementioned semiconductor material is preferably either silicon or germanium.

The aforementioned substrate is preferably a shaped article formed of an organic polymer.

The thickness of the light reflecting layer is preferably within a range from 10 to 500 nm.

The radio wave transmitting decorative member of the present invention may include a mask layer provided between the aforementioned substrate and the aforementioned light reflecting layer and containing a white pigment.

The radio wave transmitting decorative member of the present invention may also include an adhesion promoting layer provided between the aforementioned substrate and the aforementioned light reflecting layer.

Effect of the Invention

The radio wave transmitting decorative member of the present invention is provided with radio wave transmitting properties as well as mirror-surface like metallic luster, hardly loses its metallic luster, and can be produced at a low cost.

DESCRIPTION OF THE REFERENCE SYMBOLS

10: Radio wave transmitting decorative member;
12: Substrate;
14: Light reflecting layer;
16: Mask layer.

BEST MODE FOR CARRYING OUT THE INVENTION

The term "light" used in the present invention refers to visible light, and the term "radio wave" refers to electromagnetic waves having a frequency ranging from 10 MHz to 1,000 GHz (i.e., from submillimeter waves to microwaves).

<Radio Wave Transmitting Decorative Member>

Figure 1:
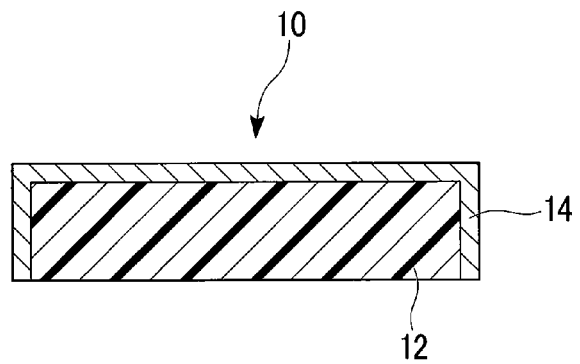
FIG. 1 is a cross sectional view showing an example of a radio wave transmitting decorative member according to the present invention.

FIG. 1 is a cross sectional view showing an example of a radio wave transmitting decorative member according to the present invention. A radio wave transmitting decorative member 10 includes a substrate 12 and a light reflecting layer 14 provided on top of the substrate 12.

(Substrate)

A radio wave transmitting substrate is used as a substrate. Examples of radio wave transmitting substrates include insulating substrates made of an insulating organic or inorganic material. The term "insulating" means a surface resistivity of $10^6 \Omega$ or higher, and the surface resistivity is preferably $10^8 \Omega$ or higher. The surface resistivity of a substrate is measured by a four-pin probe method in conformity with JIS K7194.

Examples of the substrate shape include a film, a sheet and a three-dimensional form.

An organic material is preferable as a substrate material from the viewpoint of processability.

Examples of the organic material include polyolefin (polyethylene, polypropylene, ethylene-propylene copolymer, ethylene-vinyl acetate copolymer, or the like), cyclic polyolefin, modified polyolefin, polyvinyl chloride, polyvinylidene chloride, polystyrene, polyamide (nylon 6, nylon 46, nylon 66, nylon 610, nylon 612, nylon 11, nylon 12, nylon 6-12, nylon 6-66, or the like), polyimide, polyamideimide, polycarbonate, poly-(4-methylpentene-1), an ionomer, an acrylic resin, polymethyl methacrylate, an acrylonitrile-butadiene-styrene copolymer (an ABS resin), an acrylonitrile-styrene copolymer (an AS resin), a butadiene-styrene copolymer, polyoxymethylene, polyvinyl alcohol, an ethylene-vinyl alcohol copolymer, polyester (polyethylene terephthalate, polybutylene terephthalate, polycyclohexane terephthalate, or the like), polyether, polyether ketone, polyether ether ketone, polyether imide, polyacetal, polyphenylene oxide, modified polyphenylene oxide, polysulfone, polyether sulfone, polyphenylene sulfide, polyallylate, aromatic polyester (liquid crystal polymer), polytetrafluoroethylene, polyvinylidene fluoride, other fluorine-based resins, and thermoplastic elastomers (a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, a chlorinated polyethylene-based elastomer, or the like), an epoxy resin, a phenolic resin, a urea resin, a melamine resin, unsaturated polyester, a silicone-based resin, a urethane-based resin, a polyparaxylylene resin, natural rubber, polybutadiene rubber, polyisoprene rubber, acrylonitrile-butadiene copolymer rubber, styrene-butadiene copolymer rubber, styrene-isoprene copolymer rubber, styrene-butadiene-isoprene copolymer rubber, a hydrogenated product of diene-based rubber, saturated polyolefin rubber (ethylene-α-olefin copolymers such as an ethylene-propylene copolymer), an ethylene-propylene-diene copolymer, an α-olefin-diene copolymer, urethane rubber, silicone rubber, polyether-based rubber, and acrylic rubber.

One type of these organic materials may be used alone or two or more types thereof may be combined and used as a copolymer, a blended product, a polymer alloy, a laminated body, or the like.

These organic materials may contain an additive if necessary. Examples of the additive include a reinforcement, an antioxidant, an ultraviolet absorber, a lubricant, an antifogging agent, a fog preventing agent, a plasticizer, a pigment, a near infrared absorber, an antistatic agent, and a colorant.

Examples of the inorganic material include glass (silicate glass, quartz glass, or the like), metal oxides ($Al_2O_3$, BeO, MgO, $ZrO_2$, $Cr_2O_3$, or the like), metal borides (AlN, $Si_3N_4$, TiN, or the like), metal carbides (TiC or the like), metal nitrides ($MoB_2$, $Ti_2B$, or the like), and ceramics such as metal silicides ($MoSi_2$, $W_3Si_2$, or the like).

One type of these inorganic materials may be used alone or two or more types thereof may be combined for use.

The average surface roughness of the substrate is preferably 0.5 µm or less, and more preferably 0.1 µm or less. When the average surface roughness of the substrate is 0.5 µm or less, even when the thickness of the light reflecting layer is reduced, because the light reflecting layer follows the substrate surface, a satisfactory level of mirror-surface like metallic luster can be attained.

The average surface roughness of the substrate used herein refers to an arithmetic average roughness Ra determined in accordance with JIS B 0601-2001.

(Light Reflecting Layer I)

The light reflecting layer is a layer formed of an alloy composed of either silicon or germanium and a metal. Silicon and germanium may be used at the same time.

When using an alloy composed of either silicon or germanium and a metal, the reflectance and lightness of the light reflecting layer improve, as compared to the case where either silicon or germanium is used alone, and thus a bright light reflecting layer can be obtained. In addition, because the alloy is soft compared to silicon, internal stress of the light reflecting layer reduces, thereby improving the adhesiveness with the substrate and suppressing the occurrence of cracks.

Silicon and germanium are semiconductor materials, unlike the metals described later.

Silicon and germanium may contain impurities which do not act as dopants, as long as the surface resistivity of the light reflecting layer can be maintained at a high level.

It is preferable that silicon and germanium contain as little dopants (such as boron, phosphorus, arsenic and antimony) as possible. The amount of dopants is preferably 1 ppm or less, and more preferably 10 ppb or less.

As a metal, a metal exhibiting a reflectance of 50% or higher is preferable, and a metal exhibiting a reflectance of 80% or higher is more preferable. Examples of the metal include gold, silver, copper, aluminum, platinum, iron, nickel, and chromium, and aluminum is preferred from the viewpoints of reflectance and cost.

The term "reflectance" refers to the diffuse reflectance including the regular reflectance which is measured in accordance with JIS Z 8722 under a condition of d (n-D). The reflectance is measured including the regular reflection of luster component using an integrating sphere and is calculated as an average of measured values across the visible light region, which is ranging from the short wavelength side (i.e., 360 nm to 400 nm) to the long wavelength side (i.e., 760 nm to 830 nm).

The ratio of the metal within the alloy (which is 100% in terms of volume) is preferably within a range from 0.1 to 80 volume %, and more preferably within a range from 0.1 to 60 volume %. When the ratio of the metal is 0.1 volume % or more, lightness of the light reflecting layer improves and internal stress of the light reflecting layer also reduces. When the ratio of the metal is 60 volume % or less, radio wave transmitting properties improve even further.

The alloy may contain impurities other than silicon, germanium and metals, as long as the surface resistivity and metallic luster of the light reflecting layer can be maintained at a high level.

The thickness of the light reflecting layer is preferably within a range from 10 to 500 nm, and more preferably within a range from 50 to 200 nm. When the thickness of the light reflecting layer is 10 nm or more, it becomes difficult for light to pass therethrough, and thus a satisfactory level of metallic luster can be attained. On the other hand, when the thickness of the light reflecting layer is 500 nm or less, increase in the electrical conductivity due to the presence of impurities is suppressed, and thus a satisfactory level of radio wave transmitting properties can be maintained. Moreover, increase in the internal stress can be suppressed, thereby suppressing the warp and deformation of decorative members, the occurrence of cracks, delamination or the like.

The thickness of the light reflecting layer can be measured from high resolution microscopic images of a cross section of the light reflecting layer.

The surface resistivity of the light reflecting layer is preferably $10^2 \Omega$ or higher, more preferably $10^4 \Omega$ or higher, and still more preferably $10^6 \Omega$ or higher. When the surface resistivity of the light reflecting layer is $10^2 \Omega$ or higher, a satisfactory level of radio wave transmitting properties can be maintained.

The surface resistivity of the light reflecting layer is measured by a four-pin probe method in conformity with JIS K7194.

The average surface roughness of the light reflecting layer is preferably 0.05 μm or less. When the average surface roughness of the light reflecting layer is 0.05 μm or less, irregular reflection is suppressed, and thus a satisfactory level of metallic luster can be attained. The lower limit for the average surface roughness of the light reflecting layer is set to 0.1 nm, which can be achieved with a polishing process.

Figure 2:
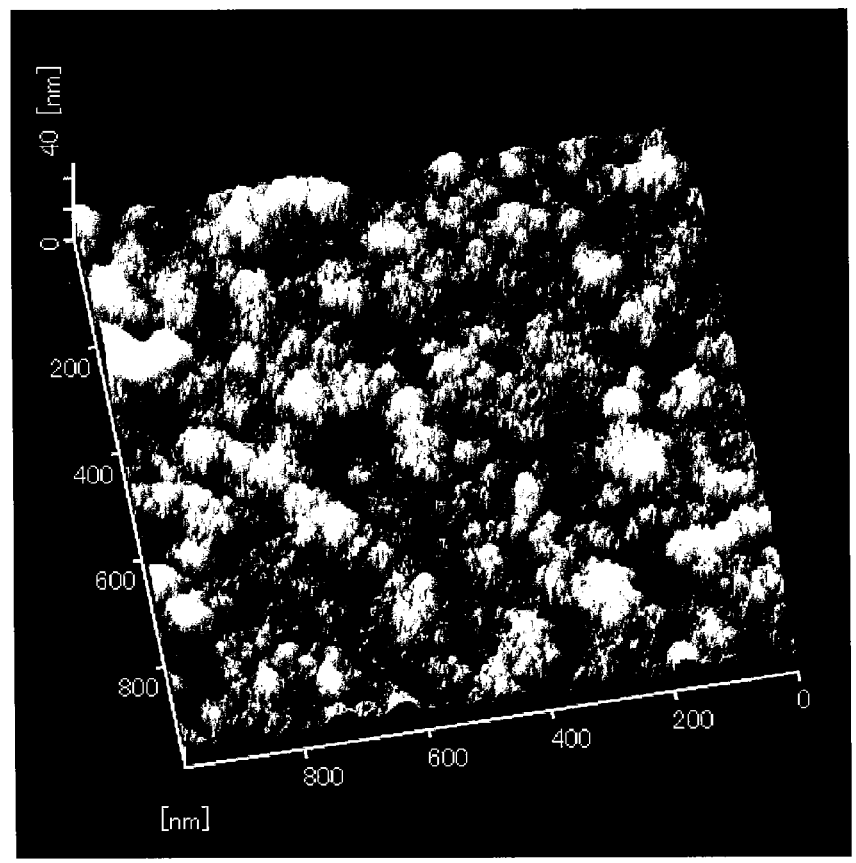
FIG. 2 is an atomic force microscope image of the surface of a light reflecting layer formed of an alloy composed of either silicon or germanium and a metal.

The average surface roughness of the light reflecting layer used herein refers to an arithmetic average roughness Ra determined in accordance with JIS B 0601-2001. More specifically, as shown in FIG. 2, a surface profile of the light reflecting layer is measured by an atomic force microscope, and a reference length is extracted in the average line direction, followed by the determination of average value (i.e., arithmetic average roughness Ra) derived from the sum of absolute values of deviations ranging from the average line in which the reference length is extracted to the roughness curve.

The light reflecting layer is formed, for example, by a physical vapor deposition of an alloy composed of either silicon or germanium and a metal.

The physical deposition process is a method for forming a thin film by vaporizing an evaporation material (an alloy) in a vacuum vessel in some way and then depositing the vaporized evaporation material on top of the substrate placed nearby, and the process can be further classified into an evaporation deposition process and a sputtering deposition process, depending on the method for vaporizing an evaporation material. Examples of the evaporation deposition process include an electron beam (EB) deposition process and an ion plating process, and examples of the sputtering deposition process include a radiofrequency (RF) sputtering process, a magnetron sputtering process, and an opposite target type magnetron sputtering process.

Although an EB deposition process tends to form a porous film having an unsatisfactory level of film strength, damages inflicted on the substrate are minimal. In addition, an ion plating process is preferred because a film having an intense adhesive force can be obtained. Moreover, a magnetron sputtering process is preferred because a film can be grown at a high growth rate, an opposite target type magnetron sputtering process is preferred because a thin film can be formed without giving plasma damages to the substrate, and an RF sputtering process is preferred because a target (evaporation material) with high resistance can be used.

Figure 3:
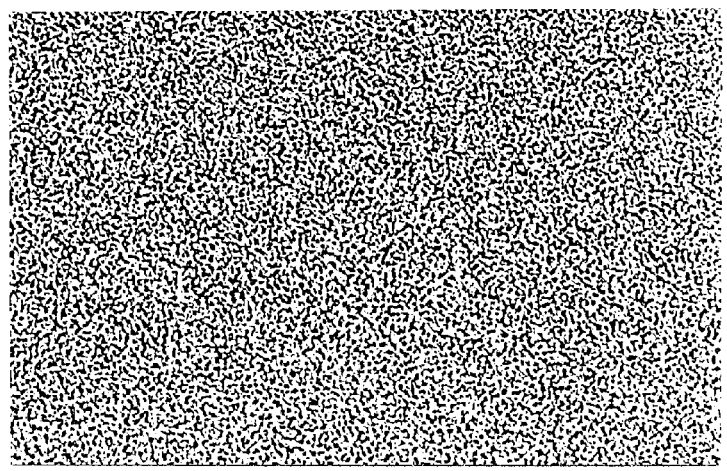
FIG. 3 is a high resolution transmission electron microscope image of the surface of a light reflecting layer formed of an alloy of either silicon or germanium and a metal.
Figure 4:
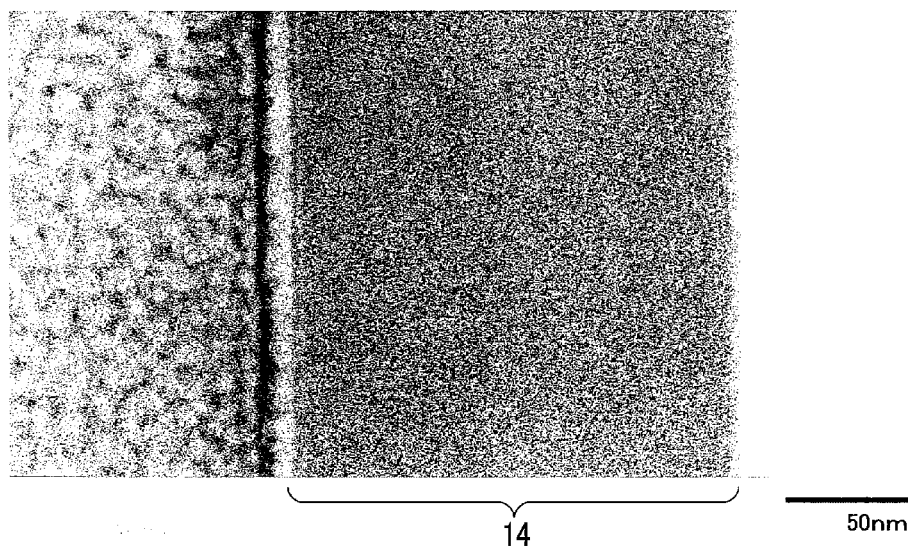
FIG. 4 is a high resolution transmission electron microscope image of the cross section of a light reflecting layer formed of an alloy of either silicon or germanium and a metal.

FIG. 3 is a high resolution transmission electron microscope image of the surface of a light reflecting layer formed by an RF sputtering process using a germanium/aluminum alloy, and FIG. 4 is a high resolution transmission electron microscope image of the cross section of the light reflecting layer. It can be seen that unlike the assembly of independent islands (microclusters) observed in conventional cases where indium, tin, or the like is used, no gap is present where the alloy is absent, as a result of which a continuous layer having a homogeneous amorphous structure is formed.

(Light Reflecting Layer II)

This light reflecting layer is a layer formed of a semiconductor material.

Examples of the semiconductor material include elements and compounds of semiconductor materials.

Examples of the elements of semiconductor materials include silicon and germanium, and silicon and germanium may be used at the same time. Germanium is preferred because it stably exhibits semiconductor characteristics at normal temperatures and its light absorption in the visible light region is minimal.

Examples of the compounds of semiconductor materials include semiconductor materials having a bandgap that falls within the infrared region, such as SiGe, GaAs, GaSb, InP, InAs, InSb, PbS, PbSe, and PbTe, and those exhibiting minimal light absorption in the visible light region are preferred.

The semiconductor material may contain impurities which do not act as dopants, as long as the surface resistivity of the light reflecting layer can be maintained at a high level.

It is preferable that the semiconductor material contain as little dopants (such as boron, phosphorus, arsenic and antimony) as possible. The amount of dopants is preferably 1 ppm or less, and more preferably 10 ppb or less.

The thickness of the light reflecting layer is preferably within a range from 10 to 500 nm, and more preferably within a range from 50 to 200 nm. When the thickness of the light reflecting layer is 10 nm or more, it becomes difficult for light to pass therethrough, and thus a satisfactory level of metallic luster can be attained. On the other hand, when the thickness of the light reflecting layer is 500 nm or less, increase in the electrical conductivity due to the presence of impurities is suppressed, and thus a satisfactory level of radio wave transmitting properties can be maintained. Moreover, increase in the internal stress can be suppressed, thereby suppressing the warp and deformation of decorative members, the occurrence of cracks, delamination or the like.

The thickness of the light reflecting layer can be measured from high resolution microscopic images of a cross section of the light reflecting layer.

The surface resistivity of the light reflecting layer is preferably $10^6 \Omega$ or higher. When the surface resistivity of the light reflecting layer is $10^6 \Omega$ or higher, a satisfactory level of radio wave transmitting properties can be maintained.

The surface resistivity of the light reflecting layer is measured by a four-pin probe method in conformity with JIS K7194.

The average surface roughness of the light reflecting layer is preferably 0.05 μm or less. When the average surface roughness of the light reflecting layer is 0.05 μm or less, irregular reflection is suppressed, and thus a satisfactory level of metallic luster can be attained. The lower limit for the average surface roughness of the light reflecting layer is set to 0.1 nm, which can be achieved with a polishing process.

Figure 11:
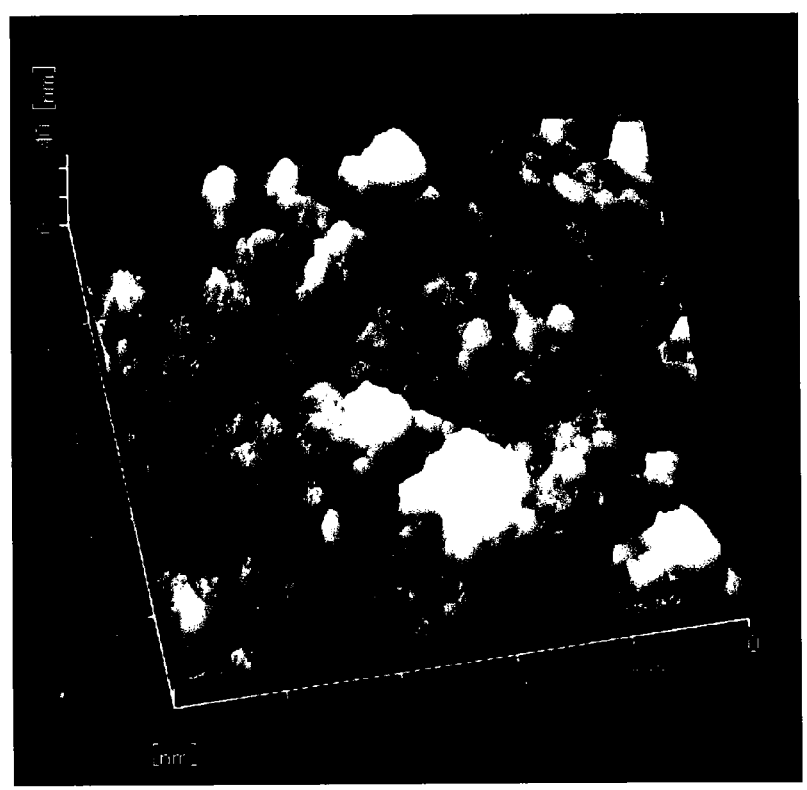
FIG. 11 is an atomic force microscope image of the surface of a light reflecting layer formed of a semiconductor material.

The average surface roughness of the light reflecting layer used herein refers to an arithmetic average roughness Ra determined in accordance with JIS B 0601-2001. More specifically, as shown in FIG. 11, a surface profile of the light reflecting layer is measured by an atomic force microscope, and a reference length is extracted in the average line direction, followed by the determination of average value (i.e., arithmetic average roughness Ra) derived from the sum of absolute values of deviations ranging from the average line in which the reference length is extracted to the roughness curve.

The light reflecting layer is formed, for example, by a physical vapor deposition of a semiconductor material.

The physical deposition process is a method for forming a thin film by vaporizing an evaporation material (a semiconductor material) in a vacuum vessel in some way and then depositing the vaporized evaporation material on top of the substrate placed nearby, and the process can be further classified into an evaporation deposition process and a sputtering deposition process, depending on the method for vaporizing an evaporation material. Examples of the evaporation deposition process include an electron beam (EB) deposition process and an ion plating process, and examples of the sputtering deposition process include a radiofrequency (RF)

sputtering process, a magnetron sputtering process, and an opposite target type magnetron sputtering process.

Although an EB deposition process tends to form a porous film having an unsatisfactory level of film strength, damages inflicted on the substrate are minimal. In addition, an ion plating process is preferred because a film having an intense adhesive force can be obtained. Moreover, a magnetron sputtering process is preferred because a film can be grown at a high growth rate, an opposite target type magnetron sputtering process is preferred because a thin film can be formed without giving plasma damages to the substrate, and an RF sputtering process is preferred because a target (evaporation material) with high resistance can be used.

Figure 12:
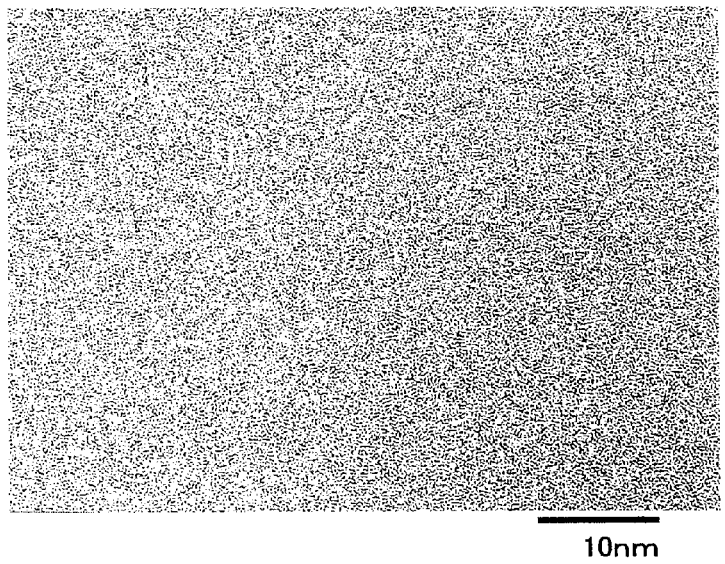
FIG. 12 is a high resolution transmission electron microscope image of the surface of a light reflecting layer formed of a semiconductor material.
Figure 13:
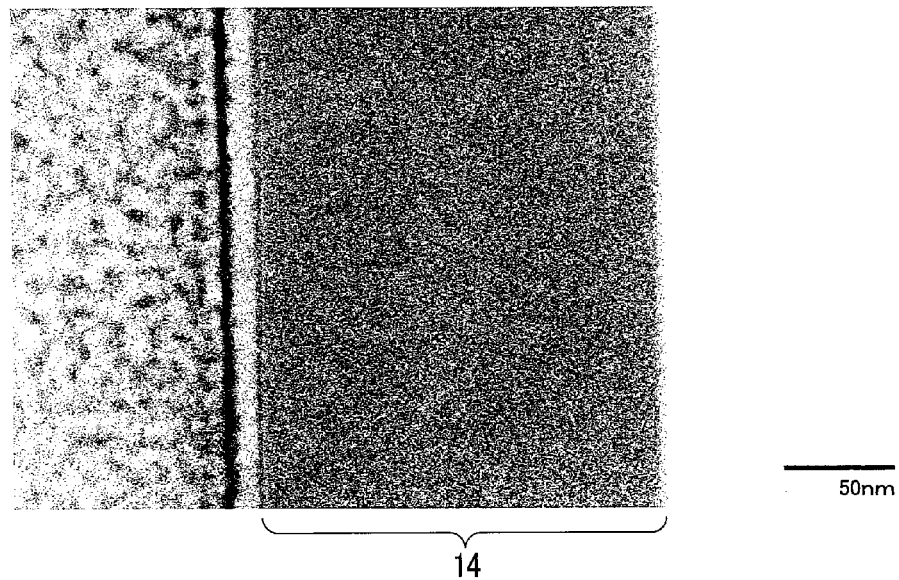
FIG. 13 is a high resolution transmission electron microscope image of the cross section of a light reflecting layer formed of a semiconductor material.

FIG. 12 is a high resolution transmission electron microscope image of the surface of a light reflecting layer formed by an RF sputtering process using silicon, and FIG. 13 is a high resolution transmission electron microscope image of the cross section of the light reflecting layer. It can be seen that unlike the assembly of independent islands (microclusters) observed in conventional cases where indium, tin, or the like is used, no gap is present where the semiconductor material is absent, as a result of which a continuous layer having a homogeneous amorphous structure is formed.

(Mask Layer)

Figure 5:
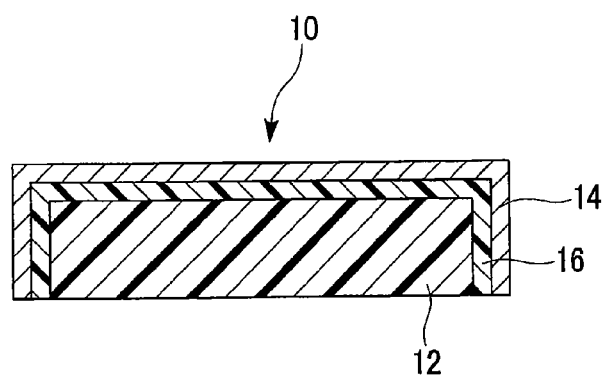
FIG. 5 is a cross sectional view showing another example of a radio wave transmitting decorative member according to the present invention.

As shown in FIG. 5, the radio wave transmitting decorative member 10 may include a mask layer 16 containing a white pigment which is provided between the substrate 12 and the light reflecting layer 14.

In those cases where the light reflecting layer is thin, because light partially passes therethrough without being reflected, the reflectance of the decorative member can be adjusted by providing a mask layer having radio wave transmitting properties between the substrate and the light reflecting layer. By increasing the level of reflectance of the mask layer, the reflectance of the decorative member is improved, and metallic luster with a high level of lightness can be obtained.

Examples of the white pigment include titanium oxide and magnesium oxide.

Examples of the method for forming such mask layers include a method in which a coating material containing a white pigment is applied, and a physical vapor deposition method using a white pigment.

(Adhesion Promoting Layer)

In order to improve the adhesiveness between the substrate and the light reflecting layer (or the mask layer), the radio wave transmitting decorative member of the present invention may include an adhesion promoting layer (not shown) provided between the substrate and the light reflecting layer (or the mask layer). In addition, if necessary, an oxidation treatment (an oxygen plasma treatment or the like) may be conducted on the substrate surface before forming the adhesion promoting layer.

Examples of the adhesion promoting layer include a silane coupling layer, a metal layer, and a hydrophilic layer.

A silane coupling layer is a layer formed of a silane coupling agent. Examples of the silane coupling agent include cyanoethyltrimethoxysilane and cyanopropyltrimethoxysilane.

A metal layer is a layer formed of a metal and having a thickness that corresponds to several metal atoms. Examples of the metal include metals that are compatible with organic materials, such as nickel, chromium, aluminum, and titanium, and the same level of insulation properties as that of the substrate is required.

Examples of the hydrophilic layer include a silicon oxide film formed by an Intro treatment or the like.

(Protective Layer)

If required, a protective layer (not shown) may be provided on the surface of the light reflecting layer.

Examples of the protective layer include a top coat layer formed of silica or the like.

The radio wave transmitting decorative member of the present invention described above includes a light reflecting layer formed of an alloy composed of either silicon or germanium and a metal which is provided on top of a substrate, and thus the radio wave transmitting decorative member exhibits radio wave transmitting properties as well as mirror-surface like metallic luster. In addition, because an alloy composed of either silicon or germanium and a metal is used which is less prone to oxidation, chlorination, or the like, as compared to the simple substance of base metals such as tin, the loss of metallic luster is less likely to occur over time. Moreover, because an alloy composed of either silicon or germanium and a metal is used which is cheaper than the simple substance of rare metals such as indium, the production cost is low.

Further, the radio wave transmitting decorative member of the present invention includes a light reflecting layer formed of a semiconductor material which is provided on top of a substrate, and thus the radio wave transmitting decorative member exhibits radio wave transmitting properties as well as mirror-surface like metallic luster. In addition, because a semiconductor material such as silicon and germanium is used which is less prone to oxidation, chlorination, or the like, as compared to the simple substance of base metals such as tin, the loss of metallic luster is less likely to occur over time. Moreover, because a semiconductor material such as silicon and germanium is used which is cheaper than the simple substance of rare metals such as indium, the production cost is low.

The reason why an alloy containing a semiconductor material such as silicon and germanium allows radio waves to pass therethrough and exhibits metallic luster is thought to be as follows.

The presence of free electrons that characterizes metals brings electrical conductivity. Moreover, when an electromagnetic wave (such as light and radio waves) is about to enter within a metal, free electrons travel to cause a strong electronic polarization, thereby inducing electric fluxes that counteracts the electric field of the entering electromagnetic wave. Accordingly, it makes it difficult for the electromagnetic wave to enter within the metal, as a result of which the electromagnetic wave is reflected without being allowed to pass therethrough. Furthermore, because the alloy exhibits high reflectance in the visible light region, the reflected light is observed as metallic luster.

On the other hand, in the case of a semiconductor material, only a limited number of free electrons are present, and thus, unlike the case of a metal, radio waves are allowed to pass therethrough without being reflected. The metallic luster is thought to be caused, not by the presence of free electrons, but by the presence of strong absorption in the visible light region due to the direct transition between the bands, thereby inducing a strong electronic polarization, as a result of which the semiconductor material exhibits a high refractive index and thus a high reflectance.

In addition, the reason why an alloy composed of either silicon or germanium and a metal is used is as follows.

Although silicon and germanium exhibits a high reflectance in the visible light region, it is lower than the reflectance of metals (for example, 98% reflectance for silver and 90% reflectance for aluminum at a wavelength of 620 nm, according to the value described in "Handbook of Optical Constants of Solids", edited by E. L. Palik (Academic Press, 1985)), which is 36% (at a wavelength of 620 nm, according to the value described in the Handbook). For this reason, by alloying silicon or germanium with a metal having a reflectance of 50% or higher, the reflectance can be improved and the lightness can be enhanced, thereby obtaining a light reflecting layer exhibiting bright metallic luster. In addition, because the metal is soft compared to silicon or the like, internal stress of the light reflecting layer reduces, thereby improving the adhesiveness thereof and suppressing the occurrence of cracks.

EXAMPLES

Radio Wave Transmitting Properties

By using a coaxial-tube type, shielding effect measuring system (manufactured by Keycom Corporation under the trade name of S-39D, in accordance with ASTM D4935), a disc shaped sample was placed inside a coaxial tube having an outer body with an inner diameter of 39 mm, and the amounts of transmission attenuation (S21) and reflection attenuation (S11) were measured using a vector network analyzer (manufactured by Anritsu Corporation under the trade name of 37247C) connected to both ends of the coaxial tube. The more the amount of transmission attenuation approaches close to 0 dB, the more excellent the radio wave transmitting properties become.

(Normally Incident Millimeter Waves Transmitting Properties)

By placing a sample between two lens antennae of a horizontal type, transmission attenuation measuring apparatus (manufactured by Keycom Corporation, in which the angle of incidence was adjustable), the amount of transmission attenuation of a normally incident millimeter wave in which the angle of incidence was 0 degree was determined using a scalar network analyzer (Wiltron 54147A (using multiplying equipment)) connected to the lens antennae. The more the amount of transmission attenuation approaches close to 0 dB, the more excellent the radio wave transmitting properties become.

(Grazing Incident Millimeter Waves Transmitting Properties)

By placing a sample between two lens antennae of a horizontal type, transmission attenuation measuring apparatus (manufactured by Keycom Corporation, in which the angle of incidence was adjustable), the amount of transmission attenuation of a grazing incident millimeter wave was determined at a measuring frequency of 76 GHz by adjusting the angle of the sample from −45 degrees to 45 degrees using a scalar network analyzer (Wiltron 54147A (using multiplying equipment)) connected to the lens antennae. The more the amount of transmission attenuation approaches close to 0 dB, the more excellent the radio wave transmitting properties become.

(Reflectance)

The term "reflectance" refers to the diffuse reflectance including the regular reflectance which is measured in accordance with JIS Z 8722 under a condition of d (n-D). The reflectance was measured including the regular reflection of luster component using an integrating sphere and was calculated as an average of measured values across the visible light region, which was ranging from the short wavelength side (i.e., 360 nm to 400 nm) to the long wavelength side (i.e., 760 nm to 830 nm).

More specifically, the reflectance of a decorative member was measured including the regular reflection of luster component using an integrating sphere, by use of an ultraviolet visible near infrared spectrophotometer (manufactured by JASCO Corporation under the trade name of V-570). An average of the values collected from 401 points of measurement that were present across a region ranging from a wavelength of 380 nm to 780 nm was then determined.

(Transmittance)

The transmittance of a decorative member was measured, by the use of an integrating sphere, using an ultraviolet visible near infrared spectrophotometer (manufactured by JASCO Corporation under the trade name of V-570).

(Thickness of Light Reflecting Layer)

The thickness of a light reflecting layer was measured at five points by observing a cross section of the light reflecting layer using a transmission electron microscope (manufactured by JEOL Ltd., under the trade name of JEM-4000EX), and the measured values were averaged.

(Average Surface Roughness)

The average surface roughness (arithmetic average roughness Ra) was determined by scanning 1 $\mu m^2$ of the surface of a light reflecting layer using a scanning probe microscope (manufactured by SII NanoTechnology Inc. under the trade name of SPA300) with a dynamic force microscopy (DFM) mode, followed by the production of an image of the surface profile.

(Surface Resistivity)

The surface resistivity of a light reflecting layer was measured by placing a series 4-pin probe (ASP) on top of a sample using a resistivity meter (Loresta GP, Model MCP-T600, manufactured by Dia Instruments Co., Ltd., in accordance with JIS K7194). The measurement voltage was set to 10 V.

(Internal Stress)

A polycarbonate sheet having a thickness of 0.3 mm and a size of 100 mm square was formed on top of a light reflecting layer, and the sheet was then placed on a surface plate, and the gap between the center of the sheet which was swelling and the surface plate was measured using a ruler. The measured gap was used as an index of internal stress.

(Adhesiveness)

The adhesiveness of a light reflecting layer was evaluated by a cross-cut adhesion test in accordance with JIS K5400.

(Chemical Identification)

A comparison was made between the components of a target and those of a deposited film using an X-ray diffractometer (manufactured by Shimadzu Corporation under the trade name of XRD-6100) to determine whether the components of the deposited film were the same as those of the target.

Example 1

An alloy composed of silicon and aluminum which was doped with boron (aluminum ratio: 10 volume %, amount of doped boron: approximately 1 ppb) was prepared as a target. The reflectance of a simple substance of aluminum is 87.6%.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the polycarbonate sheet having a thickness of 0.3 mm by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. Moreover, when the chemical identification was made, it was found that the ratio of aluminum in the light reflecting layer was the same as the ratio of aluminum in the target. The results are shown in Table 1.

Figure 6:
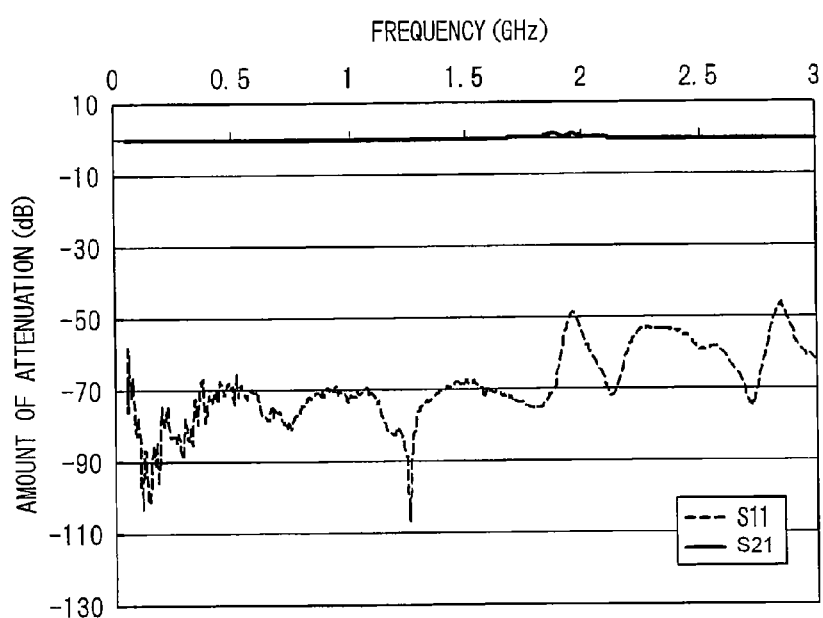
FIG. 6 shows a graph indicating the amount of transmission attenuation (S21) and amount of reflection attenuation (S11) of a radio wave transmitting decorative member obtained in Example 1.
Figure 7:
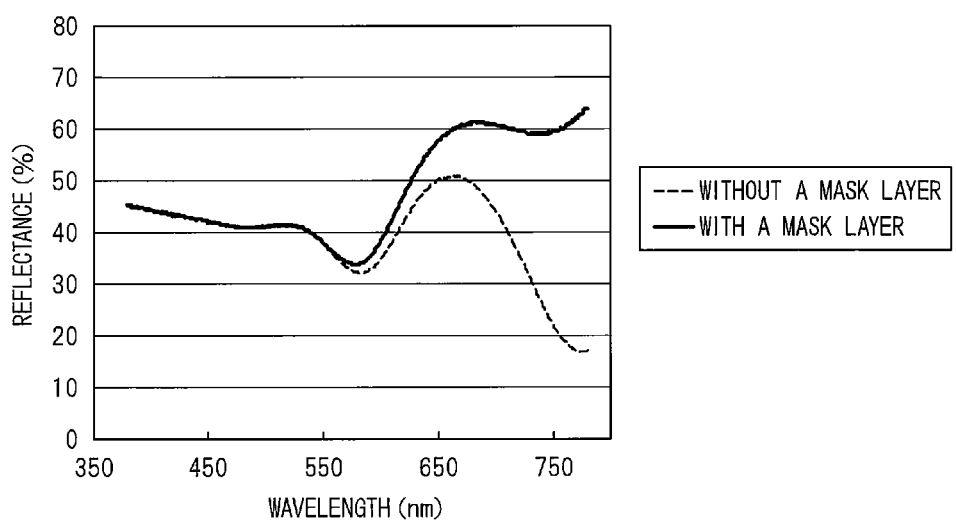
FIG. 7 shows a graph indicating the reflectance of radio wave transmitting decorative members obtained in Example 1 and Example 10.
Figure 8:
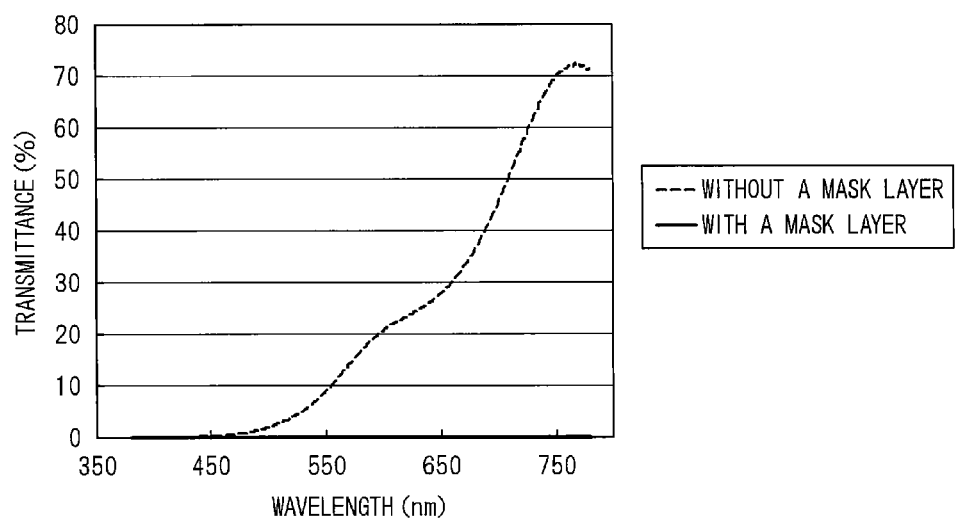
FIG. 8 shows a graph indicating the transmittance of radio wave transmitting decorative members obtained in Example 1 and Example 10.

Moreover, a graph indicating the amount of transmission attenuation (S21) and amount of reflection attenuation (S11) of the decorative member is shown in FIG. 6. Furthermore, a graph indicating the reflectance of the decorative member (shown as the data obtained "without a mask layer") is shown in FIG. 7, and a graph indicating the transmittance of the decorative member (shown as the data obtained "without a mask layer") is shown in FIG. 8.

Examples 2 to 8

Decorative members were prepared in a similar way to that of Example 1, except that the ratio of aluminum was changed to the ratios indicated in Table 1.

With respect to the obtained decorative members, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative members was observed. Note that the ratio of aluminum in the light reflecting layer was set to the same aluminum ratio as in the target. The results are shown in Tables 1 and 2.

Comparative Example 1

A decorative member was prepared in a similar way to that of Example 1, except that a simple substance of aluminum was used as a target.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative members was observed. The results are shown in Table 2.

TABLE 1

|  | Ex. 1 | Ex. 2 | Ex. 3 | Ex. 4 | Ex. 5 |
| --- | --- | --- | --- | --- | --- |
| Ratio of Aluminum (volume %) | 10 | 20 | 30 | 40 | 50 |
| Thickness of light reflecting layer (nm) Light reflecting layer | 200 | 200 | 200 | 200 | 200 |
| Average surface roughness (nm) | 3.4 | 2.8 | 2.0 | 2.3 | 3.1 |
| Amount of transmission attenuation (dB) | | | | | |
| 1 GHz | 0.0 | 0.0 | 0.0 | 0.0 | 0.0 |
| 3 GHz | 0.0 | 0.0 | 0.0 | 0.0 | 0.0 |
| Reflectance (%) | | | | | |
| 400 nm | 48.1 | 50.4 | 51.3 | 52.4 | 56.9 |
| 500 nm | 43.9 | 47.4 | 49.2 | 50.4 | 56.8 |
| 600 nm | 40.6 | 45.7 | 47.7 | 49.0 | 56.9 |
| 700 nm | 48.0 | 44.1 | 46.7 | 47.8 | 56.9 |
| Average value | 44.4 | 46.7 | 48.5 | 49.6 | 56.9 |
| Surface resistivity ($\Omega$) | $10^8$ or higher | $10^8$ or higher | $10^8$ or higher | $3 \times 10^7$ | $4 \times 10^4$ |
| Internal stress (mm) | 6.0 | 5.2 | 4.1 | 2.7 | 1.8 |
| Outer appearance | Presence of metallic luster | Presence of metallic luster | Presence of metallic luster | Presence of metallic luster | Presence of metallic luster |

TABLE 2

|  | Ex. 6 | Ex. 7 | Ex. 8 | Comp. Ex. 1 |
| --- | --- | --- | --- | --- |
| Ratio of Aluminum (volume %) | 60 | 70 | 80 | 100 |
| Thickness of light reflecting layer (nm) Light reflecting layer | 200 | 200 | 200 | 200 |
| Average surface roughness (nm) | 4.2 | 2.2 | 3.6 | 2.2 |
| Amount of transmission attenuation (dB) | | | | |
| 1 GHz | −0.6 | −6.3 | −7.7 | −50.8 |
| 3 GHz | −0.6 | −6.3 | −7.5 | −51.0 |
| Reflectance (%) | | | | |
| 400 nm | 58.0 | 58.7 | 60.3 | 80.8 |
| 500 nm | 59.4 | 61.1 | 64.9 | 86.6 |
| 600 nm | 60.2 | 62.3 | 66.7 | 87.7 |
| 700 nm | 60.7 | 62.6 | 66.7 | 86.3 |
| Average value | 59.9 | 61.7 | 65.2 | 85.7 |
| Surface resistivity ($\Omega$) | $4 \times 10^3$ | $2 \times 10^3$ | $2 \times 10^2$ | $4 \times 10^{-1}$ |
| Internal stress (mm) | 1.6 | 0.6 | 0.6 | 1.7 |
| Outer appearance | Presence of metallic luster | Presence of metallic luster | Presence of metallic luster | Presence of metallic luster |

Example 9

A polypropylene sheet (containing 10% by mass of organized montmorillonite) having a thickness of 0.5 mm was degreased and washed, and the surface thereof was then subjected to an oxygen plasma treatment. Subsequently, chromium was sputtered thereon, thereby forming an adhesion promoting layer having a thickness that corresponds to that of one and a half (1.5) chromium atoms.

An alloy composed of germanium and aluminum (aluminum ratio: 40 volume %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the adhesion promoting layer by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured, and the adhesiveness (calculated as (the number of cells peeled off)/(the number of total cells)) was also evaluated. In addition, the outer appearance of the decorative member was observed. The results are shown in Table 3. No delamination of the light reflecting layer was observed.

Example 10

A polymethyl methacrylate sheet having a thickness of 0.5 mm was degreased and washed, and the surface thereof was then subjected to an oxygen plasma treatment. Subsequently, titanium was sputtered thereon, thereby forming an adhesion promoting layer having a thickness that corresponds to that of one (1.0) titanium atom.

A white acrylic coating material which contained a titanium oxide powder and exhibited high masking properties was applied onto the adhesion promoting layer, thereby forming a mask layer.

An alloy composed of silicon and aluminum (aluminum ratio: 10 volume %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the mask layer by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. The results are shown in Table 3.

Furthermore, a graph indicating the reflectance of the decorative member (shown as the data obtained "with a mask layer") is shown in FIG. 7, and a graph indicating the transmittance of the decorative member (shown as the data obtained "with a mask layer") is shown in FIG. 8. Compared to the decorative member obtained in Example 1, the reflectance improved and the transmittance value almost reached 0 with the decorative member obtained in Example 10 due to the effects achieved by the mask layer. As a result, the decorative member obtained in Example 10 exhibited metallic luster with a high level of lightness.

TABLE 3

|  | Ex. 9 | Ex. 10 |
| --- | --- | --- |
| Other layers | Adhesion promoting layer | Adhesion promoting layer Mask layer |
| Ratio of Aluminum (volume %) | 40 | 10 |
| Thickness of light reflecting layer (nm) Light reflecting layer | 75 | 100 |
| Average surface roughness (nm) | 4.7 | 8.5 |
| Amount of transmission attenuation (dB) |  |  |
| 1 GHz | 0.0 | 0.0 |
| 3 GHz | 0.0 | 0.0 |
| Reflectance (%) |  |  |
| 400 nm | 52.7 | 44.3 |
| 500 nm | 51.4 | 41.1 |
| 600 nm | 50.3 | 38.1 |
| 700 nm | 47.7 | 60.8 |
| Average value | 49.9 | 48.1 |
| Transmittance (%) |  |  |
| 400 nm | — | 0 |
| 500 nm | — | 0 |
| 600 nm | — | 0 |
| 700 nm | — | 0 |
| Average value | — | 0 |
| Surface resistivity (Ω) | $10^8$ or higher | $10^8$ or higher |
| Internal stress (mm) | 0.2 | 2.6 |
| Adhesiveness | 100/100 | — |
| Outer appearance | Presence of metallic luster | Presence of metallic luster |

Example 11

A polycarbonate sheet having a thickness of 2.5 mm was degreased and washed, and the surface thereof was then subjected to an oxygen plasma treatment. Subsequently, an acrylate coating material containing fine silica particles was applied thereon, followed by the curing thereof by ultraviolet irradiation, thereby forming an adhesion promoting layer.

A sintered alloy composed of germanium and aluminum (aluminum ratio: 30 volume %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the adhesion promoting layer by an RF sputtering process.

Figure 9:
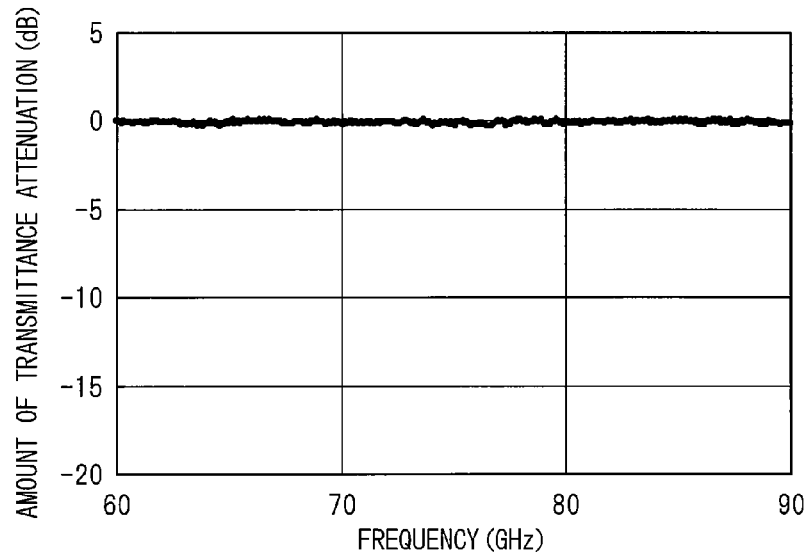
FIG. 9 shows a graph indicating the amount of transmission attenuation of a normally incident radio wave for a radio wave transmitting decorative member obtained in Example 11.

With respect to the obtained decorative member, the thickness of the light reflecting layer, the amount of transmission attenuation of normally incident radio waves from 60 GHz and 90 GHz, the reflectance, and the surface resistivity were measured. In addition, the outer appearance of the decorative member was observed. The results are shown in Table 4, and a graph indicating the amount of transmission attenuation of normally incident radio waves for the decorative member is shown in FIG. 9.

The decorative member obtained in Example 11 exhibited a satisfactory level of transmittance value almost reaching 0 even with the radio waves within a high frequency band ranging from 60 GHz to 90 GHz, and also exhibited metallic luster with a high level of lightness.

Example 12

A polycarbonate sheet having a thickness of 2.5 mm was degreased and washed, and the surface thereof was then subjected to an oxygen plasma treatment. Subsequently, a white acrylate coating material which contained a magnesium oxide powder and exhibited high masking properties was applied thereon, followed by the curing thereof by ultraviolet irradiation, thereby forming a mask layer.

A sintered alloy composed of germanium and silver (silver ratio: 0.1 volume %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the mask layer by an RF sputtering process.

Figure 10:
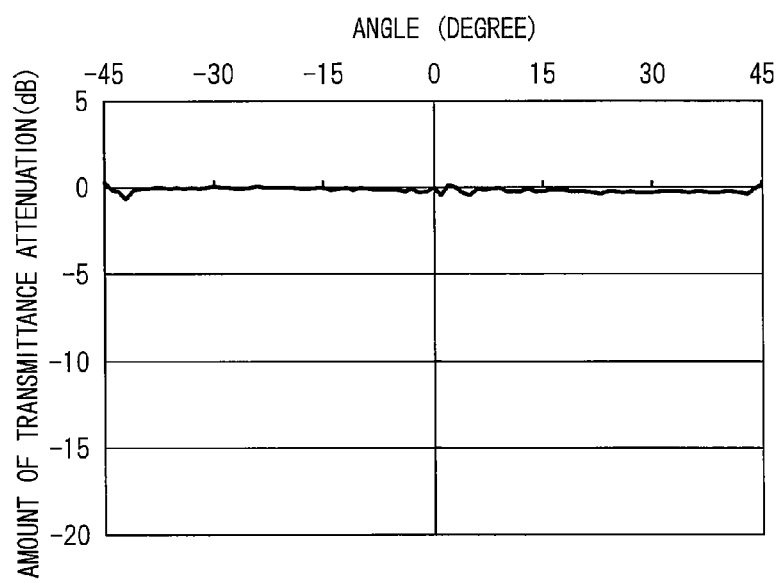
FIG. 10 shows a graph indicating the amount of transmission attenuation of a grazing incident radio wave for a radio wave transmitting decorative member obtained in Example 12.

With respect to the obtained decorative member, the thickness of the light reflecting layer, the amount of transmission attenuation of a grazing incident radio wave at 76 GHz when the angle of incidence was changed from −45 degrees to 45 degrees, the reflectance, and the surface resistivity were measured. In addition, the outer appearance of the decorative member was observed. The results are shown in Table 4, and a graph indicating the amount of transmission attenuation of a grazing incident radio wave for the decorative member is shown in FIG. 10.

The decorative member obtained in Example 12 exhibited a transmittance value of substantially 0 indicating a satisfactory level of rectilinear propagation of radio wave at 76 GHz within a high frequency band with a minimal level of adverse effects even when the angle of incidence was changed, and also exhibited metallic luster with a high level of lightness.

TABLE 4

|  | Ex. 11 | Ex. 12 |
|---|---|---|
| Ratio of Aluminum (volume %) | 30 | — |
| Ratio of silver (volume %) | — | 0.1 |
| Thickness of light reflecting layer (nm) | 500 | 10 |
| Reflectance (%) |  |  |
| 400 nm | 51.2 | 49.4 |
| 500 nm | 49.2 | 47.7 |
| 600 nm | 47.8 | 47.9 |
| 700 nm | 47.0 | 49.2 |
| Average value | 48.6 | 48.2 |
| Surface resistivity (Ω) | $10^8$ or higher | $10^8$ or higher |
| Outer appearance | Presence of metallic luster | Presence of metallic luster |

Example 13

Silicon doped with boron (amount of doped boron: approximately 1 ppb) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target semiconductor material on top of the polycarbonate sheet having a thickness of 0.3 mm by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. The results are shown in Table 5.

Figure 14:
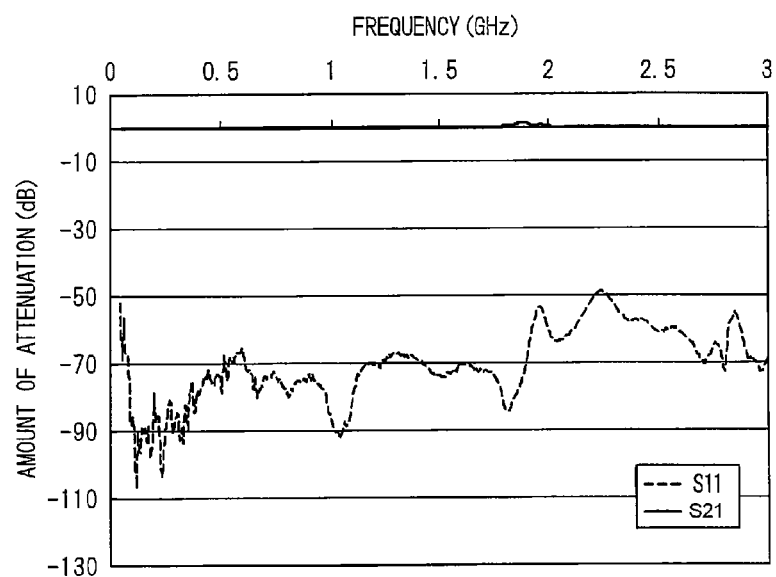
FIG. 14 shows a graph indicating the amount of transmission attenuation (S21) and amount of reflection attenuation (S11) of a radio wave transmitting decorative member obtained in Example 13.

Moreover, a graph indicating the amount of transmission attenuation (S21) and amount of reflection attenuation (S11) of the decorative member is shown in FIG. 14.

Figure 15:
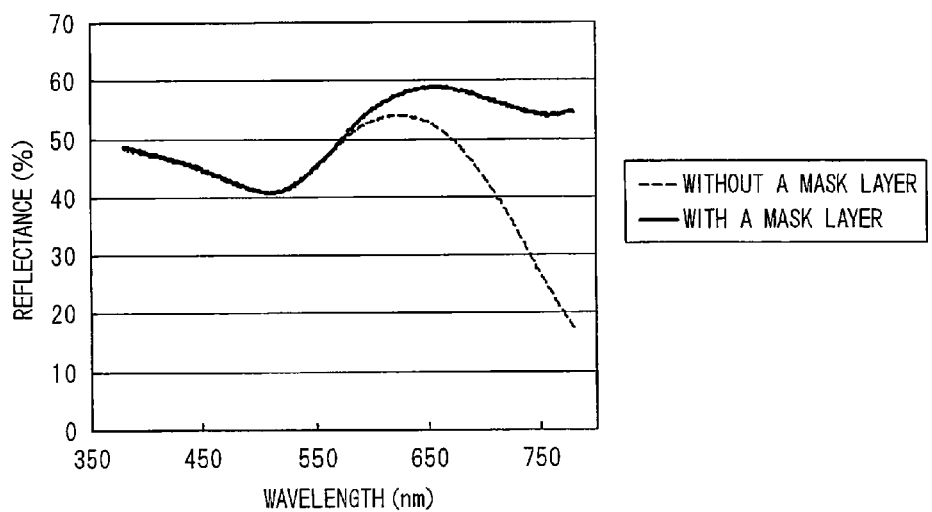
FIG. 15 shows a graph indicating the reflectance of radio wave transmitting decorative members obtained in Example 13 and Example 17.
Figure 16:
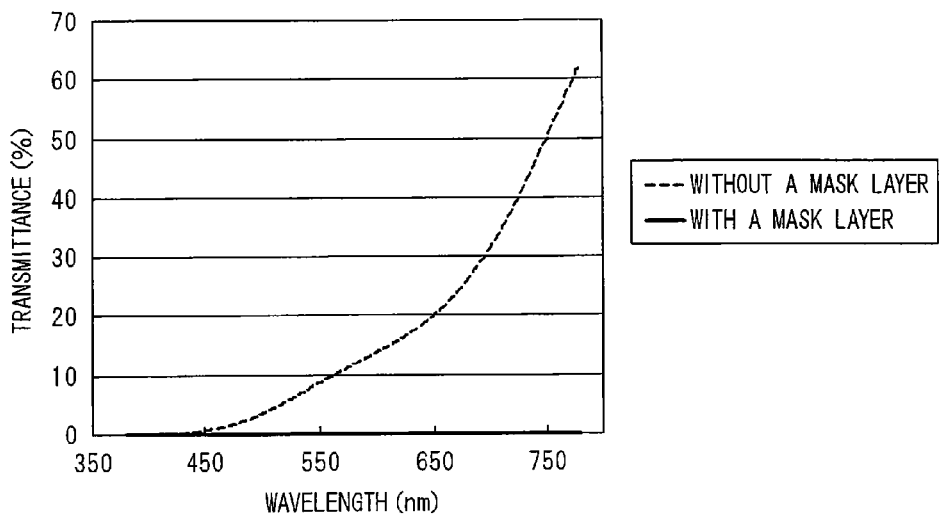
FIG. 16 shows a graph indicating the transmittance of radio wave transmitting decorative members obtained in Example 13 and Example 17.

Furthermore, a graph indicating the reflectance of the decorative member (shown as the data obtained "without a mask layer") is shown in FIG. 15, and a graph indicating the transmittance of the decorative member (shown as the data obtained "without a mask layer") is shown in FIG. 16.

Examples 14 and 15

Decorative members were prepared in a similar way to that of Example 13, except that the conditions for the RF sputtering process were changed so that the thickness of the light reflecting layer would become the thickness indicated in Table 5.

With respect to the obtained decorative members, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative members was observed. The results are shown in Table 5.

Comparative Example 2

A decorative member was prepared in a similar way to that of Example 13, except that a simple substance of aluminum was used as a target.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. The results are shown in Table 5.

TABLE 5

|  | Ex. 13 | Ex. 14 | Ex. 15 | Comp. Ex. 2 |
|---|---|---|---|---|
| Thickness of light reflecting layer (nm) | 100 | 200 | 400 | 100 |
| Light reflecting layer |  |  |  |  |
| Average surface roughness (nm) | 2.3 | 1.8 | 2.0 | 2.5 |
| Amount of transmission attenuation (dB) |  |  |  |  |
| 1 GHz | 0.0 | 0.0 | 0.0 | −45.1 |
| 3 GHz | 0.0 | 0.0 | 0.0 | −46.1 |

TABLE 5-continued

|  | Ex. 13 | Ex. 14 | Ex. 15 | Comp. Ex. 2 |
|---|---|---|---|---|
| Reflectance (%) | | | | |
| 400 nm | 47.4 | 44.3 | 47.3 | 78.4 |
| 500 nm | 40.9 | 41.0 | 43.2 | 84.0 |
| 600 nm | 53.0 | 34.6 | 41.5 | 85.1 |
| 700 nm | 43.3 | 44.0 | 48.9 | 83.7 |
| Average value | 43.8 | 39.2 | 43.2 | 83.1 |
| Surface resistivity (Ω) | $10^8$ or higher | $10^8$ or higher | $10^8$ or higher | $8 \times 10^{-1}$ |
| Internal stress (mm) | 3.1 | 6.4 | 9.7 | 1.2 |
| Outer appearance | Presence of slightly reddish black metallic luster | Presence of slightly reddish metallic luster | Presence of metallic luster | Presence of metallic luster |

Example 16

A polypropylene sheet (containing 10% by mass of organized montmorillonite) having a thickness of 0.5 mm was degreased and washed, and the surface thereof was then subjected to an oxygen plasma treatment. Subsequently, chromium was sputtered thereon, thereby forming an adhesion promoting layer having a thickness that corresponds to that of one and a half (1.5) chromium atoms.

GaAs (containing 50.005% of As in terms of atomic %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target semiconductor material on top of the adhesion promoting layer by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured, and the adhesiveness (calculated as (the number of cells peeled off)/(the number of total cells)) was also evaluated. In addition, the outer appearance of the decorative member was observed. The results are shown in Table 6. No delamination of the light reflecting layer was observed.

Example 17

A polymethyl methacrylate sheet having a thickness of 0.5 mm was degreased and washed, and the surface thereof was then subjected to an oxygen plasma treatment. Subsequently, titanium was sputtered thereon, thereby forming an adhesion promoting layer having a thickness that corresponds to that of one (1.0) titanium atom.

A white acrylic coating material which contained a titanium oxide powder and exhibited high masking properties was applied onto the adhesion promoting layer, thereby forming a mask layer.

Silicon was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target semiconductor material on top of the adhesion promoting layer by an RF sputtering process.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. The results are shown in Table 6.

Furthermore, a graph indicating the reflectance of the decorative member (shown as the data obtained "with a mask layer") is shown in FIG. 15, and a graph indicating the transmittance of the decorative member (shown as the data obtained "with a mask layer") is shown in FIG. 16. Compared to the decorative member obtained in Example 13, the reflectance improved and the transmittance value almost reached 0 with the decorative member obtained in Example 17 due to the effects achieved by the mask layer. As a result, the decorative member obtained in Example 17 exhibited metallic luster with a high level of lightness.

Example 18

A decorative member was prepared in a similar way to that of Example 13, except that germanium doped with boron (amount of doped boron: approximately 0.1 ppb) was used as a target.

With respect to the obtained decorative member, the thickness of the light reflecting layer, the average surface roughness, the amounts of transmission attenuation (S21) at 1 GHz and 3 GHz, the reflectance, the surface resistivity, and the internal stress were measured. In addition, the outer appearance of the decorative member was observed. The results are shown in Table 6.

Figure 17:
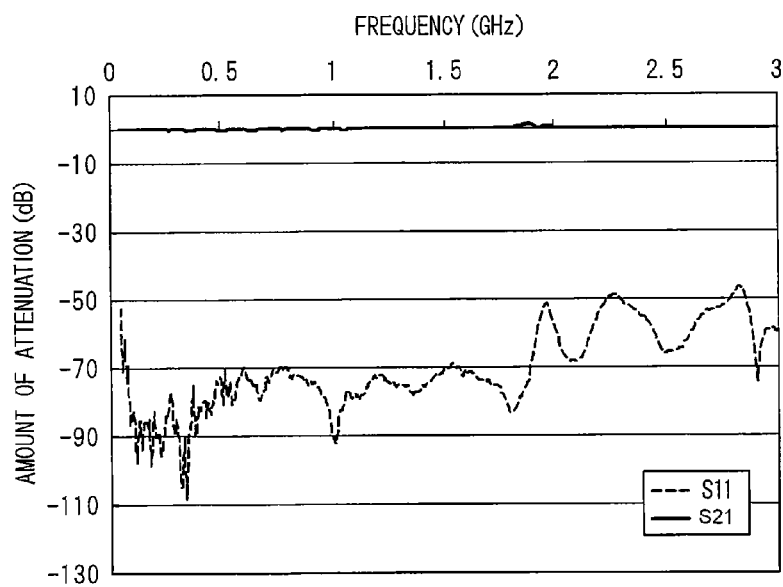
FIG. 17 shows a graph indicating the amount of transmission attenuation (S21) and amount of reflection attenuation (S11) of a radio wave transmitting decorative member obtained in Example 18.

Moreover, a graph indicating the amount of transmission attenuation (S21) and amount of reflection attenuation (S11) of the decorative member is shown in FIG. 17.

TABLE 6

|  | Ex. 16 | Ex. 17 | Ex. 18 |
|---|---|---|---|
| Other layers | Adhesion promoting layer | Adhesion promoting layer Mask layer | — |
| Thickness of light reflecting layer (nm) | 75 | 100 | 100 |
| Light reflecting layer | | | |
| Average surface roughness (nm) | 5.1 | 7.9 | 3.2 |
| Amount of transmission attenuation (dB) | | | |
| 1 GHz | 0.0 | 0.0 | 0.0 |
| 3 GHz | 0.0 | 0.0 | 0.0 |

TABLE 6-continued

|  | Ex. 16 | Ex. 17 | Ex. 18 |
|---|---|---|---|
| Reflectance (%) | | | |
| 400 nm | 50.1 | 47.5 | 49.5 |
| 500 nm | 48.0 | 41.1 | 47.6 |
| 600 nm | 45.5 | 55.0 | 47.9 |
| 700 nm | 39.7 | 57.0 | 49.2 |
| Average value | 44.6 | 50.6 | 48.3 |
| Transmittance (%) | | | |
| 400 nm | — | 0 | — |
| 500 nm | — | 0 | — |
| 600 nm | — | 0 | — |
| 700 nm | — | 0 | — |
| Average value | — | 0 | — |
| Surface resistivity (Ω) | $10^8$ or higher | $10^8$ or higher | $2 \times 10^7$ |
| Internal stress (mm) | 0.3 | 3.1 | 1.5 |
| Adhesiveness | 100/100 | — | — |
| Outer appearance | Presence of metallic luster | Presence of metallic luster | Presence of metallic luster |

Example 19

A polycarbonate sheet having a thickness of 2.5 mm was degreased and washed, and the surface thereof was then subjected to an oxygen plasma treatment. Subsequently, a white acrylate coating material which contained a magnesium oxide powder and exhibited high masking properties was applied thereon, followed by the curing thereof by ultraviolet irradiation, thereby forming a mask layer.

A sintered alloy composed of germanium and silver (silver ratio: 0.1 volume %) was prepared as a target.

The target was mounted on an RF sputtering apparatus (manufactured by Shibaura Mechatronics Corporation under the trade name of CFS-4ES) as a cathode, and after evacuating the inside of a vacuum chamber, argon gas was introduced thereto. A decorative member was obtained by physically depositing the target alloy on top of the mask layer by an RF sputtering process.

Figure 18:
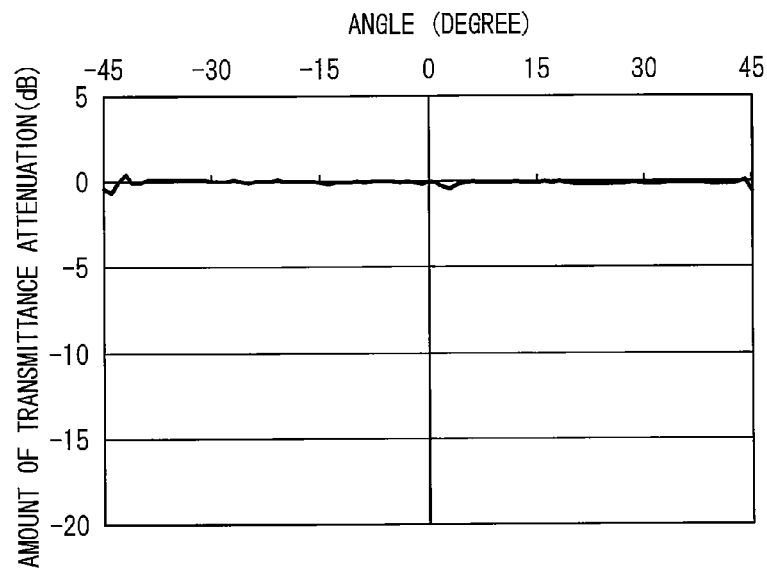
FIG. 18 shows a graph indicating the amount of transmission attenuation of a grazing incident radio wave for a radio wave transmitting decorative member obtained in Example 19.

With respect to the obtained decorative member, the thickness of the light reflecting layer, the amount of transmission attenuation of a grazing incident radio wave at 76 GHz when the angle of incidence was changed from −45 degrees to 45 degrees, the reflectance, and the surface resistivity were measured. In addition, the outer appearance of the decorative member was observed. The results are shown in Table 7, and a graph indicating the amount of transmission attenuation of a grazing incident radio wave for the decorative member is shown in FIG. 18.

The decorative member obtained in Example 19 exhibited a transmittance value of substantially 0 indicating a satisfactory level of rectilinear propagation of radio wave at 76 GHz within a high frequency band with a minimal level of adverse effects even when the angle of incidence was changed, and also exhibited metallic luster with a high level of lightness.

Example 20

A decorative member was prepared in a similar way to that of Example 19, except that the thickness of the light reflecting layer was 500 nm.

Figure 19:
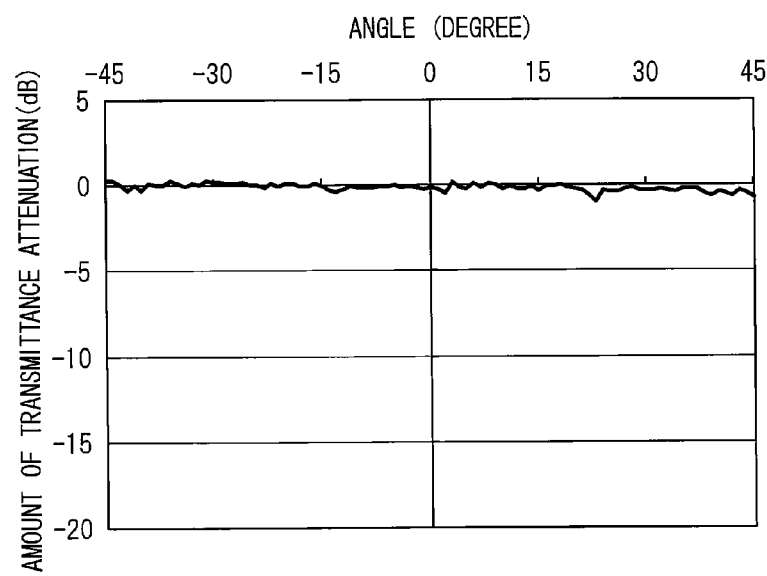
FIG. 19 shows a graph indicating the amount of transmission attenuation of a grazing incident radio wave for a radio wave transmitting decorative member obtained in Example 20.

With respect to the obtained decorative member, the thickness of the light reflecting layer, the amount of transmission attenuation of a grazing incident wave at 76 GHz when the angle of incidence was changed from −45 degrees to 45 degrees, the reflectance, and the surface resistivity were measured. In addition, the outer appearance of the decorative member was observed. The results are shown in Table 7, and a graph indicating the amount of transmission attenuation of a grazing incident wave for the decorative member is shown in FIG. 19.

The decorative member obtained in Example 20 exhibited a transmittance value of substantially 0 indicating a satisfactory level of rectilinear propagation of radio wave at 76 GHz within a high frequency band with a minimal level of adverse effects even when the angle of incidence was changed, and also exhibited metallic luster with a high level of lightness.

TABLE 7

|  | Ex. 19 | Ex. 20 |
|---|---|---|
| Thickness of light reflecting layer (nm) | 10 | 500 |
| Reflectance (%) | | |
| 400 nm | 49.2 | 49.5 |
| 500 nm | 47.4 | 47.7 |
| 600 nm | 47.6 | 47.9 |
| 700 nm | 49.1 | 49.2 |
| Average value | 48.0 | 48.4 |
| Surface resistivity (Ω) | $10^8$ or higher | $5 \times 10^7$ |
| Outer appearance | Presence of metallic luster | Presence of metallic luster |

INDUSTRIAL APPLICABILITY

The radio wave transmitting decorative member of the present invention is useful, for example, as the casing or button of a mobile phone; the casing of a radio controlled clock; the casing of a communication device; and the front grille, bumper or the like of a vehicle equipped with a radar device.

The invention claimed is:

1. A radio wave transmitting decorative member comprising:
   a substrate which is a shaped article formed of an organic material; and
   a light reflecting layer provided on top of the substrate and formed of an alloy composed of a metal element and either silicon element or germanium element,
   wherein a ratio of the metal within the alloy is within a range from 0.1 to 60 volume %, based on the volume of the alloy,
   the light reflecting layer is a continuous layer comprising a homogenous amorphous structure in which no gaps are present where the alloy is absent, and
   the organic material is at least one member selected from the group consisting of polyolefin, cyclic polyolefin, modified polyolefin, polyvinyl chloride, polyvinylidene chloride, polystyrene, polyamide, polyimide, polyamideimide, polycarbonate, poly-(4-methylpentene-1), an ionomer, an acrylic resin, polymethyl methacrylate, an acrylonitrile-butadiene-styrene copolymer, an acrylonitrile-styrene copolymer, a butadiene-styrene copolymer, polyoxymethylene, polyvinyl alcohol, an ethylene-vinyl alcohol copolymer, polyester, polyether, polyether ketone, polyether ether ketone, polyether imide, polyacetal, polyphenylene oxide, modified polyphenylene oxide, polysulfone, polyether sulfone, polyphenylene sulfide, polyallylate, aromatic polyester, polytetrafluoroethylene, polyvinylidene fluoride, a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, a chlorinated polyethylene-based elastomer, an epoxy resin, a phenolic resin, a urea resin, a melamine resin, unsaturated polyester, a silicone-based resin, a urethane-based resin, a polyparaxylylene resin, natural rubber, polybutadiene rubber, polyisoprene rubber, acrylonitrile-butadiene copolymer rubber, styrene-butadiene copolymer rubber, styrene-isoprene copolymer rubber, styrene-butadiene-isoprene copolymer rubber, a hydrogenated product of diene-based rubber, saturated polyolefin rubber, an ethylene-propylene-diene copolymer, an a-olefin-diene copolymer, urethane rubber, silicone rubber, polyether-based rubber, and acrylic rubber.

2. The radio wave transmitting decorative member according to claim 1, wherein the light reflecting layer is a deposition film formed by a physical vapor deposition of an alloy composed of either silicon or germanium and a metal.

3. The radio wave transmitting decorative member according to claim 1, wherein the metal is a metal exhibiting a reflectance of 50% or higher.

4. The radio wave transmitting decorative member according to claim 1, wherein a thickness of the light reflecting layer is within a range from 10 to 500 nm.

5. The radio wave transmitting decorative member according to claim 1, further comprising:

a mask layer provided between the substrate and the light reflecting layer and comprising a white pigment.

6. The radio wave transmitting decorative member according to claim 1, further comprising:

an adhesion promoting layer provided between the substrate and the light reflecting layer.

* * * * *